(12) United States Patent
Yazawa et al.

(10) Patent No.: US 12,419,002 B2
(45) Date of Patent: Sep. 16, 2025

(54) FIXING STRUCTURE OF CIRCUIT BOARD AND PUMP DEVICE

(71) Applicant: NIDEC INSTRUMENTS CORPORATION, Nagano (JP)

(72) Inventors: Takehiko Yazawa, Nagano (JP); Kazuhiko Yanagisawa, Nagano (JP)

(73) Assignee: NIDEC INSTRUMENTS CORPORATION, Nagano (JP)

( * ) Notice: Subject to any disclaimer, the term of this patent is extended or adjusted under 35 U.S.C. 154(b) by 126 days.

(21) Appl. No.: 18/421,995

(22) Filed: Jan. 25, 2024

(65) Prior Publication Data

US 2024/0276667 A1   Aug. 15, 2024

(30) Foreign Application Priority Data

Feb. 10, 2023   (JP) .................. 2023-018852

(51) Int. Cl.
*H05K 7/14* (2006.01)
*F04D 13/06* (2006.01)
(Continued)

(52) U.S. Cl.
CPC ....... *H05K 7/1417* (2013.01); *F04D 13/0606* (2013.01); *F04D 13/064* (2013.01); *F04D 13/0686* (2013.01); *H02K 11/33* (2016.01); *H05K 5/0026* (2013.01); *H05K 7/14* (2013.01); *H05K 7/1407* (2013.01); *H05K 7/1454* (2013.01); *F04D 13/0626* (2013.01);
(Continued)

(58) Field of Classification Search
CPC ............. F04D 13/0606; F04D 13/0626; F04D 13/064; F04D 13/0686; H02K 5/02; H02K 5/08; H02K 5/225; H02K 11/33; H05K 5/0026; H05K 5/0069; H05K 7/14; H05K 7/1407; H05K 7/1417; H05K 7/1454
USPC ........................................ 417/423.1
See application file for complete search history.

(56) References Cited

U.S. PATENT DOCUMENTS

2007/0286723 A1 * 12/2007 Ihle ............... F04D 13/0686
  415/206
2008/0219839 A1 *  9/2008 Pfetzer ........... F04D 13/0686
  417/423.12
(Continued)

FOREIGN PATENT DOCUMENTS

DE   102014201488 A1 *  7/2015 .......... H02K 3/522
EP     3530959 A1 *  8/2019 .......... F04D 13/0606
(Continued)

*Primary Examiner* — Jorge L Leon, Jr.
(74) *Attorney, Agent, or Firm* — JCIPRNET (57) ABSTRACT

A fixing structure of a circuit board includes a circuit board, a board fixing member, and a fixing screw for fixing the circuit board to the board fixing member. The circuit board is formed with a cut-out part in a "U"-shape recessed from its outer peripheral face, the board fixing member is formed with a protruding part. The protruding part is formed with a flat board contact face with which the circuit board is contacted, a screw hole with which the fixing screw is engaged, and a positioning protruded part engaged with the cut-out part for positioning the circuit board. The screw hole is recessed from the board contact face, the positioning protruded part protrudes from the board contact face, and the positioning protruded part is disposed on an opening side of the cut-out part with respect to the screw hole.

6 Claims, 6 Drawing Sheets

(51) Int. Cl.
    *H02K 11/33*     (2016.01)
    *H05K 5/00*     (2006.01)
    *H02K 5/02*     (2006.01)
    *H02K 5/08*     (2006.01)
    *H02K 5/22*     (2006.01)

(52) U.S. Cl.
    CPC ............ *H02K 5/02* (2013.01); *H02K 5/08* (2013.01); *H02K 5/225* (2013.01); *H05K 5/0069* (2013.01)

(56) References Cited

U.S. PATENT DOCUMENTS

2017/0093252 A1*   3/2017   Otsubo ............... H02K 7/08
2020/0200158 A1*   6/2020   Kuratani ........... F04D 13/0693

FOREIGN PATENT DOCUMENTS

| | | | | |
|---|---|---|---|---|
| JP | 2013204431 A | * | 10/2013 | ......... F04D 13/0686 |
| JP | 2017216759 A | * | 12/2017 | ......... F04D 13/0606 |
| JP | 2019157684 A | * | 9/2019 | ........... F04D 29/426 |
| JP | 2020172923 A | * | 10/2020 | ........... F04D 13/064 |
| JP | 2022020101 A | * | 2/2022 | ......... F04D 13/0606 |
| JP | 2022102073 | | 7/2022 | |
| WO | WO-2017057437 A1 | * | 4/2017 | ............... H02K 7/14 |

\* cited by examiner

FIXING STRUCTURE OF CIRCUIT BOARD AND PUMP DEVICE

CROSS REFERENCE TO RELATED APPLICATION

The present invention claims priority under 35 U.S.C. § 119 to Japanese Application No. 2023-018852 filed Feb. 10, 2023, the entire content of which is incorporated herein by reference.

TECHNICAL FIELD

At least an embodiment of the present invention may relate to a fixing structure of a circuit board which includes a circuit board which is a rigid board in a flat plate shape and a board fixing member to which the circuit board is fixed. Further, at least an embodiment of the present invention may relate to a pump device provided with the fixing structure of the circuit board.

BACKGROUND

Conventionally, a pump device has been known which includes an impeller and a rotor which are disposed inside a pump chamber, a stator and a circuit board (board) which are disposed outside the pump chamber, and a housing made of resin which covers the stator (see, for example, Japanese Patent Laid-Open No. 2022-102073 (Patent Literature 1)). In the pump device described in Patent Literature 1, the circuit board is a rigid board which is formed in a flat plate shape and is fixed to the housing by two screws in a state positioned in a circumferential direction of the rotor. The housing is formed with two pillar shaped parts for fixing the circuit board and four protruded parts for positioning the circuit board. The two pillar shaped parts and the four protruded parts are arranged in a state spaced with predetermined distances in the circumferential direction of the rotor. The pillar shaped part is formed with a screw hole with which a screw is engaged.

In the pump device described in Patent Literature 1, the circuit board is formed with two fixing cut-out parts for fixing the circuit board and four positioning cut-out parts for positioning the circuit board. The fixing cut-out part and the positioning cut-out part are recessed from an outer peripheral face of the circuit board toward an inner side of the circuit board. The fixing cut-out part is formed in a "U"-shape. One face of the circuit board is contacted with a tip end face of the pillar shaped part. A part of a shaft part of a screw is disposed in the fixing cut-out part. A head part of the screw is contacted with the other face of the circuit board. The protruded part of the housing is engaged with the positioning cut-out part.

In the pump device described in Patent Literature 1, when a designed gap space between the positioning cut-out part formed in the circuit board and the protruded part formed in the housing is widened, it is difficult that the circuit board is appropriately positioned with respect to the housing by using the positioning cut-out part and the protruded part. As a result, fixing work of the circuit board to the housing may be complicated. Therefore, in this pump device, when fixing work of the circuit board to the housing is considered, it is preferable that a designed gap space between the positioning cut-out part and the protruded part is narrow.

On the other hand, in the pump device described in Patent Literature 1, the two pillar shaped parts and the four protruded parts which are formed in the housing are arranged in a state spaced with predetermined distances in a circumferential direction of the rotor, and the protruded part utilized for positioning the circuit board and the pillar shaped part utilized for fixing the circuit board are separated from each other in the circumferential direction of the rotor. Further, in the pump device, the positioning cut-out part and the fixing cut-out part formed in the circuit board are separated from each other in the circumferential direction of the rotor.

Therefore, in the pump device described in Patent Literature 1, in a case that a designed gap space between the positioning cut-out part and the protruded part is narrowed, when a relative position between a screw hole of the pillar shaped part and the protruded part varies or, when a relative position between the fixing cut-out part and the positioning cut-out part varies (in other words, when dimensions of the housing and the circuit board vary), a deviation amount between a position of the fixing cut-out part of the circuit board which is positioned by the positioning cut-out part and the protruded part and a position of a screw hole of the pillar shaped part of the housing becomes large and thus, a screw may be unable to fasten into a screw hole of the pillar shaped part.

SUMMARY

In view of the problem described above, at least an embodiment of the present invention may advantageously provide a fixing structure of a circuit board including a circuit board which is a rigid board in a flat plate shape, a board fixing member to which the circuit board is fixed, and a fixing screw for fixing the circuit board to the board fixing member. The fixing structure of the circuit board is capable of appropriately positioning the circuit board with respect to the board fixing member and, even when dimensions of the board fixing member and the like vary, the fixing screw is capable of appropriately being fastened into the board fixing member. Further, at least an embodiment of the present invention may advantageously provide a pump device including the fixing structure of the circuit board.

According to at least an embodiment of the present invention, there may be provided a fixing structure of a circuit board including a circuit board which is a rigid board in a flat plate shape, a board fixing member to which the circuit board is fixed, and a fixing screw for fixing the circuit board to the board fixing member. The circuit board is formed with a cut-out part in a "U"-shape which is recessed from an outer peripheral face of the circuit board toward an inner side of the circuit board, and the board fixing member is formed with a protruding part which protrudes in a thickness direction of the circuit board. The protruding part is formed with a board contact face in a flat face shape with which one of faces of the circuit board is contacted, a screw hole with which a shaft part of the fixing screw is engaged, and a positioning protruded part which is engaged with the cut-out part for positioning the circuit board with respect to the board fixing member. The screw hole is recessed from the board contact face, the positioning protruded part protrudes from the board contact face, a part of the shaft part of the fixing screw is disposed inside the cut-out part, a head part of the fixing screw is contacted with another one of the faces of the circuit board, and the positioning protruded part is disposed on an opening side of the cut-out part with respect to the screw hole.

In a fixing structure of a circuit board in accordance with at least an embodiment of the present invention, a protruding part of a board fixing member is formed with a screw hole with which a shaft part of a fixing screw is engaged, and a positioning protruded part which engages with a cut-out part of the circuit board. Therefore, according to the present invention, the screw hole can be arranged in the vicinity of the positioning protruded part and, as a result, even when a relative position between the positioning protruded part and the screw hole varies, a deviation amount between a position of the positioning protruded part and a position of the screw hole can be reduced. Accordingly, in the present invention, a deviation amount between a position of the cut-out part of the circuit board which is positioned by the positioning protruded part and the cut-out part and a position of the screw hole can be reduced.

Therefore, in the present invention, even when a gap space between the cut-out part of the circuit board and the positioning protruded part is made narrow and, further, even when a relative position between the positioning protruded part and the screw hole varies, the fixing screw a part of the shaft part of which is disposed inside the cut-out part can be appropriately fastened to the screw hole. In other words, according to the present invention, the circuit board can be appropriately positioned with respect to the board fixing member by narrowing a gap space between the cut-out part of the circuit board and the positioning protruded part and, even when dimensions of the board fixing member and the like vary, the fixing screw a part of a shaft part of which is disposed inside the cut-out part can be appropriately fastened to the screw hole.

Further, in the present invention, the positioning protruded part is disposed on an opening side of the cut-out part with respect to the screw hole. Therefore, in comparison with a case that the screw hole is disposed on an opening side of the cut-out part with respect to the positioning protruded part, a contact area of a head part of the fixing screw contacting with the other face of the circuit board with the circuit board can be increased. Accordingly, in the present invention, the circuit board can be appropriately fixed to the board fixing member by the fixing screw. Further, in the present invention, a contact area of the head part of the fixing screw with the circuit board can be increased and thus, although the circuit board can be appropriately fixed to the board fixing member by the fixing screw, a contact pressure of the head part of the fixing screw with the circuit board can be prevented from being increased unnecessarily. Therefore, according to the present invention, cracking of the circuit board can be prevented when the fixing screw is fastened.

Commonly, an outer shape of the circuit board which is a rigid board is formed by press working which uses a metal mold or router processing. An end face of the circuit board formed by router processing is smoother than an end face of a circuit board formed by press working and thus, when an outer shape of the circuit board is formed by router processing, quality of the circuit board can be enhanced. Further, when an outer shape of the circuit board is formed by router processing, the outer shape of the circuit board can be formed with a high degree of accuracy. In the present invention, the cut-out part which is recessed from an outer peripheral face of the circuit board toward an inner side of the circuit board is formed in a "U"-shape and thus, even when the outer shape of the circuit board is formed by router processing, the cut-out part can be easily formed in the circuit board.

In the present invention, it is preferable that the circuit board is formed with a terminal hole through which an inserted part of a terminal is passed, the circuit board is positioned with respect to the board fixing member in a circumferential direction with a center of the circuit board as a center by a side face of the positioning protruded part and a side face of the cut-out part in a width direction of the cut-out part formed in the "U"-shape, and a difference between a width of the positioning protruded part and a width of the cut-out part in a width direction of the cut-out part is smaller than a difference between a width of the inserted part and a width of the terminal hole in the circumferential direction. According to this structure, the inserted part of the terminal can be prevented from contacting with a side face of the terminal hole. Therefore, quality of a soldered portion of the inserted part which is soldered and fixed to the terminal hole can be secured.

In the present invention, it is preferable that a shape of a side face on the screw hole side of the positioning protruded part when viewed in a thickness direction of the circuit board is formed in a curved surface shape which is a circular arc shape whose center of curvature is a center of the screw hole. According to this structure, a shaft part of the fixing screw which is fastened into the screw hole is easily guided into the screw hole by utilizing the side face of the positioning protruded part. Therefore, fastening work of the fixing screw can be performed easily.

The fixing structure of the circuit board in accordance with the present invention may be used in a pump device including an impeller, a rotor to which the impeller is attached and which has a drive magnet, a stator which is formed in a tube shape and is disposed on an outer peripheral side with respect to the rotor and has a drive coil, and a pump chamber in which the impeller and the rotor are disposed and through which fluid is passed. In the pump device, the stator includes a terminal with which an end part of the drive coil is electrically connected, a board fixing member is formed of resin and is integrally formed with the stator in a manner as to cover a part of the stator, the circuit board is disposed outside the pump chamber, and the circuit board is electrically connected with the terminal. In the pump device, the circuit board can be appropriately positioned with respect to the board fixing member and, even when dimensions of the board fixing member and the like vary, the fixing screw a part of a shaft part of which is disposed inside the cut-out part of the circuit board can be appropriately fastened into the screw hole of the board fixing member.

Effects of the Invention

As described above, according to the present invention, in a fixing structure of a circuit board including a circuit board which is a rigid board in a flat plate shape, a board fixing member to which the circuit board is fixed, and a fixing screw for fixing the circuit board to the board fixing member, the circuit board can be appropriately positioned with respect to the board fixing member and, even when dimensions of the board fixing member and the like vary, the fixing screw can be appropriately fastened into the board fixing member.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Embodiments of the present invention will be described below with reference to the accompanying drawings.

Entire Structure of Pump Device

Figure 1:
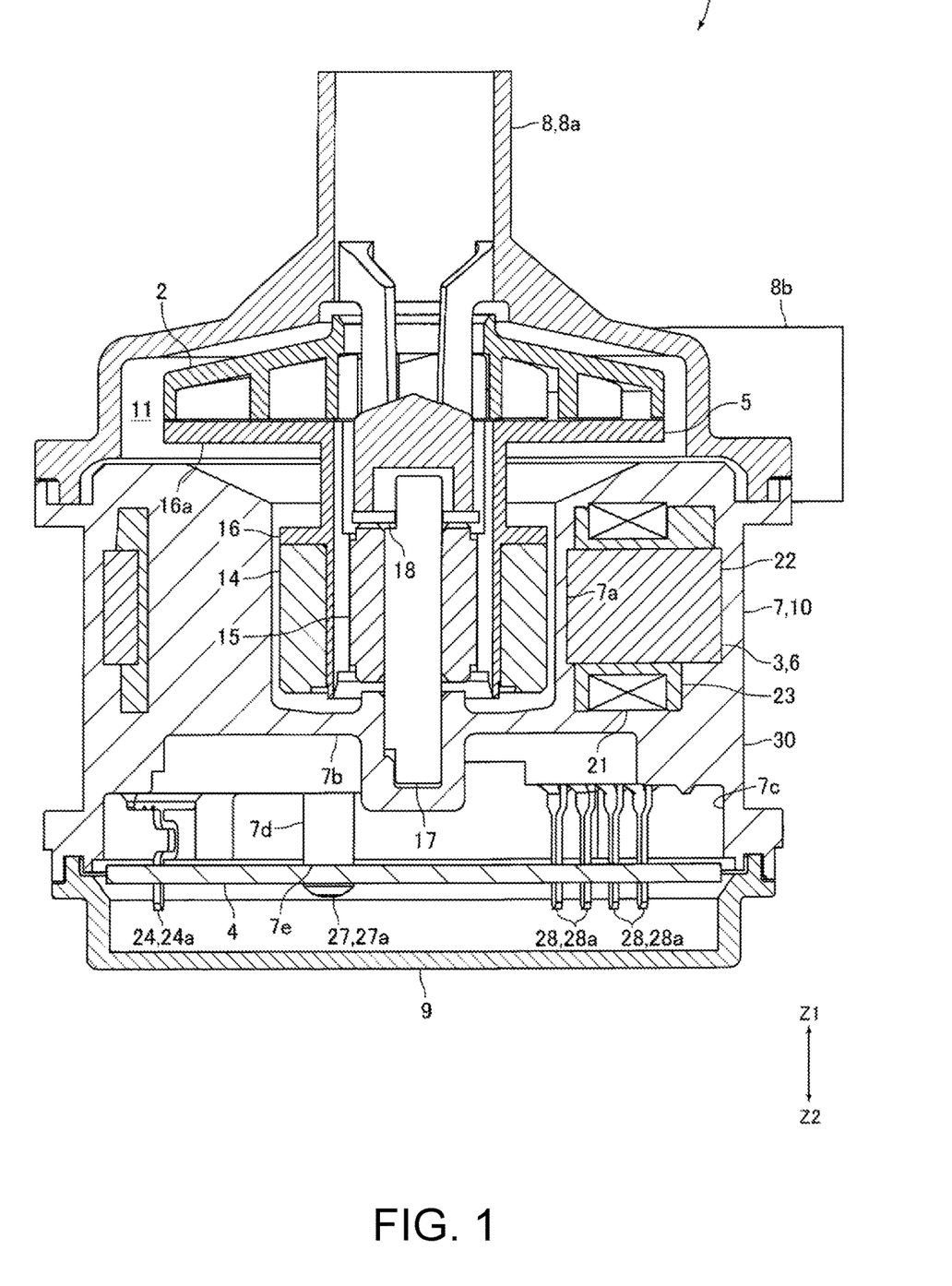
FIG. 1 is a cross-sectional view showing a pump device in accordance with an embodiment of the present invention.
Figure 2:
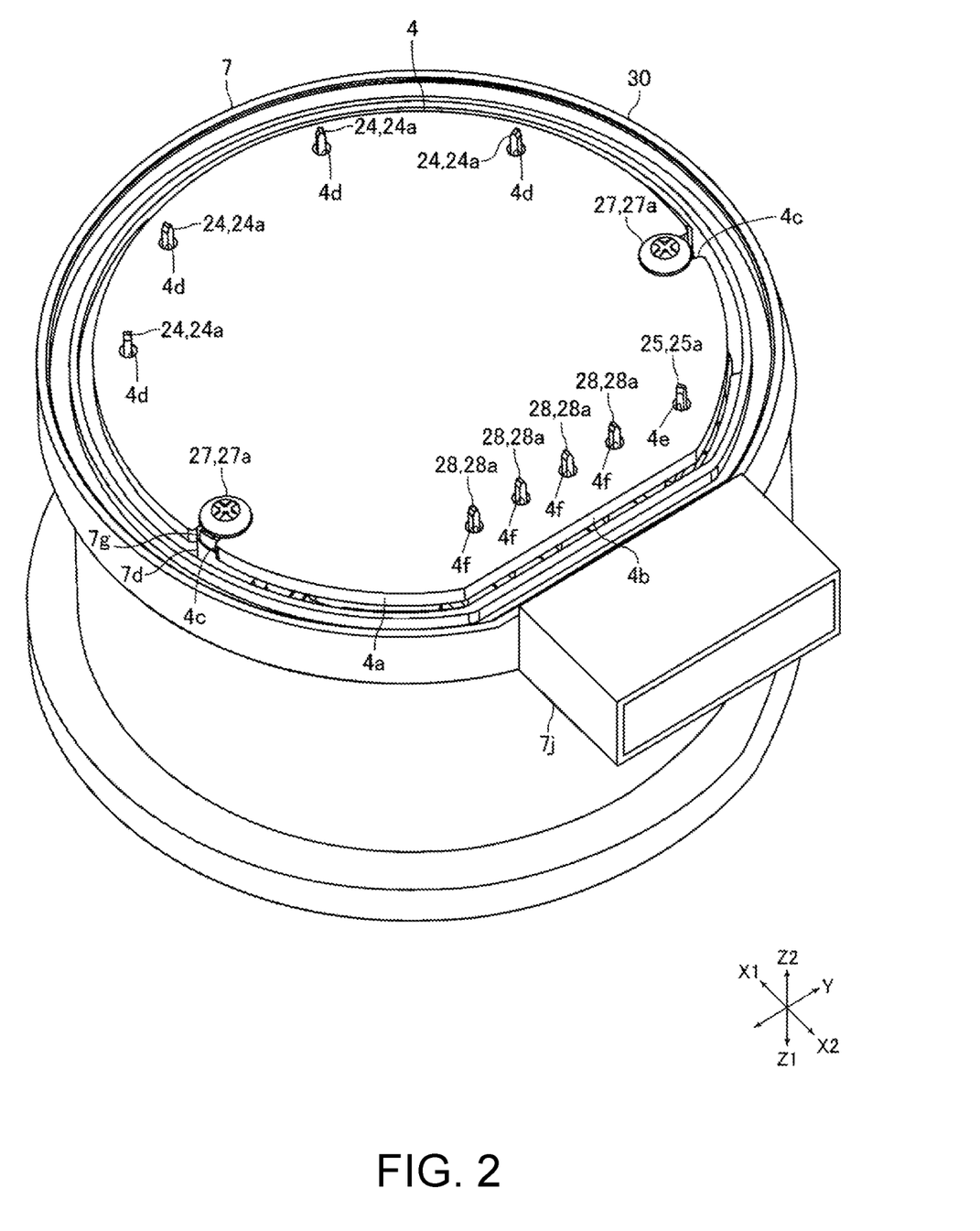
FIG. 2 is a perspective view showing the pump device in FIG. 1 from which a case and a cover are detached and which is viewed from its bottom face side.

FIG. 1 is a cross-sectional view showing a pump device 1 in accordance with an embodiment of the present invention. FIG. 2 is a perspective view showing the pump device 1 in FIG. 1 from which a case 8 and a cover 9 are detached and which is viewed from its bottom face side. In the following descriptions, the "Z1" direction side in FIG. 1 and the like is an "upper" side, and the "Z2" direction side in FIG. 1 and the like which is an opposite side to the upper side is a "lower" side.

A pump device 1 in this embodiment is a pump in a type referred to as a canned pump (canned motor pump) and is, for example, used for circulating cooling liquid. The pump device 1 includes an impeller 2, a motor 3 for rotating the impeller 2, and a circuit board 4 for controlling the motor 3. The motor 3 is structured of a rotor 5 and a stator 6. The impeller 2, the motor 3 and the circuit board 4 are disposed inside a case body 10 which is structured of a housing 7, a case 8 which covers an upper side of the housing 7, and a cover 9 which covers a lower side of the housing 7.

The housing 7, the case 8 and the cover 9 are formed of resin. The case 8 is joined to an upper end of the housing 7 by ultrasonic welding, and the cover 9 is joined to a lower end of the housing 7 by ultrasonic welding. The case 8 is formed of a suction part 8a for fluid and a discharge part 8b for the fluid. An inside of the case body 10 is formed with a pump chamber 11 through which the fluid sucked through the suction part 8a is passed toward the discharge part 8b. The pump chamber 11 is formed by the housing 7 and the case 8.

The rotor 5 includes a drive magnet 14 in a cylindrical tube shape, a sleeve 15 in a cylindrical tube shape, and a hold member 16 which holds the drive magnet 14 and the sleeve 15. The hold member 16 is formed of resin. Further, the hold member 16 is formed in a substantially cylindrical tube shape with a flange. The drive magnet 14 is fixed to an outer peripheral side of the hold member 16, and the sleeve 15 is fixed to an inner peripheral side of the hold member 16. The impeller 2 is formed of resin. The impeller 2 is joined to an upper face of the flange part 16a which structures an upper end part of the hold member 16 by ultrasonic welding. In other words, the impeller 2 is attached to the rotor 5. The impeller 2 and the rotor 5 are disposed in the pump chamber 11.

The rotor 5 is rotatably supported by a fixed shaft 17. The fixed shaft 17 is disposed so that an axial direction of the fixed shaft 17 and an upper and lower direction are coincided with each other. In other words, the upper and lower direction is an axial direction of the rotor 5. An upper end of the fixed shaft 17 is held by the case 8, and a lower end of the fixed shaft 17 is held by the housing 7. The fixed shaft 17 is passed through an inner peripheral side of the sleeve 15. The fixed shaft 17 is attached with a thrust bearing member 18 which is contacted with an upper end face of the sleeve 15. In this embodiment, the sleeve 15 functions as a radial bearing of the rotor 5, and the sleeve 15 and the thrust bearing member 18 function as a thrust bearing of the rotor 5.

The stator 6 is formed in a tube shape. Specifically, the stator 6 is formed in a substantially cylindrical tube shape as a whole. The stator 6 is disposed on an outer peripheral side with respect to the rotor 5. Further, the stator 6 is disposed so that an axial direction of the stator 6 and the upper and lower direction are coincided with each other. In other words, the upper and lower direction is an axial direction of the stator 6. The stator 6 includes a drive coil 21, a stator core 22 and an insulator 23. Further, the stator 6 includes a plurality of terminals 24 with which end parts of the drive coil 21 are bound and electrically connected, and a terminal 25 for grounding. In this embodiment, the stator 6 includes four terminals 24 and one terminal 25.

The stator core 22 is a laminated core which is, for example, structured by laminating thin magnetic plates made of magnetic material. The stator core 22 is provided with an outer peripheral ring part which is formed in a ring shape, and a plurality of salient pole parts which are protruded toward an inner side in a radial direction from the outer peripheral ring part. A tip end face (inner side face in the radial direction) of the salient pole part faces an outer peripheral face of the drive magnet 14 through a cylindrical tube part 7a described below which structures a part of the housing 7. The insulator 23 is formed of insulation material such as resin. The drive coil 21 is structured of a conductive wire which is made of an aluminum alloy or copper alloy. The drive coil 21 is wound around the salient pole part of the stator core 22 through the insulator 23.

The terminals 24 and 25 are fixed to the insulator 23. The terminals 24 and 25 are protruded toward a lower side from the insulator 23. The terminal 24 is provided with an inserted part 24a which is passed through a terminal hole 4d formed in the circuit board 4 described below. The inserted part 24a structures a lower side portion of the terminal 24. The terminal 25 is provided with an inserted part 25a which is passed through a terminal hole 4e formed in the circuit board 4 described below. The inserted part 25a structures a lower side portion of the terminal 25. The inserted parts 24a and 25a are formed in a straight shape extending toward a lower side.

As described above, the housing 7 is formed of resin. The housing 7 is integrally formed with the stator 6 in a manner as to cover a part of the stator 6. In this embodiment, the housing 7 is integrally molded with the stator 6 by insert molding. The housing 7 completely covers the drive coil 21, the stator core 22 and the insulator 23. Further, the housing 7 covers upper end parts of the terminals 24 and 25. The housing 7 is provided with a cylindrical tube part 7a in a cylindrical tube shape which is disposed between a tip end face of the salient pole part of the stator core 22 and an outer peripheral face of the drive magnet 14, and a bottom part 7b which closes a lower end of the cylindrical tube part 7a.

A lower end part of the housing 7 is formed with a recessed part 7c which is recessed toward an upper side. The recessed part 7c is disposed on a lower side of the bottom part 7b. Further, the recessed part 7c is disposed on a lower side with respect to the drive coil 21, the stator core 22 and the insulator 23. The circuit board 4 is disposed at a lower end part of the recessed part 7c. The housing 7 functions as preventing fluid inside the pump chamber 11 from flowing to an arrangement portion of the stator 6 and the circuit board 4. The cover 9 is fixed to a lower end of the housing 7 in a manner as to cover the circuit board 4 disposed in the recessed part 7c from a lower side.

The circuit board 4 is a rigid board such as a glass epoxy substrate and is formed in a flat plate shape. The circuit board 4 is disposed so that a thickness direction of the circuit board 4 and the upper and lower direction are coincided with each other. Further, the circuit board 4 is disposed outside the pump chamber 11. The circuit board 4 is fixed to the housing 7 by a fixing screw 27. In this embodiment, the circuit board 4 is fixed to the housing 7 by two fixing screws 27. The circuit board 4 is electrically connected with the terminals 24 and 25.

Further, the circuit board 4 is electrically connected with a plurality of terminals 28 for interface. In this embodiment, four terminals 28 are connected with the circuit board 4. The terminals 28 are fixed to the housing 7. One end part of the terminal 28 is protruded toward a lower side, and the other end part of the terminal 28 is protruded toward an outer peripheral side of the housing 7. The one end part of the terminal 28 protruded toward a lower side is formed as an inserted part 28a which is passed through a terminal hole 4f formed in the circuit board 4 described below. The inserted part 28a is formed in a straight shape extending toward a lower side. The other end part of the terminal 28 which is protruded toward an outer peripheral side of the housing 7 is disposed inside a connector part 7j formed in the housing 7.

The housing 7 in this embodiment is a board fixing member to which the circuit board 4 is fixed. Further, in this embodiment, a fixing structure 30 of the circuit board is structured of the circuit board 4, the housing 7, two fixing screws 27 and the like, and the fixing structure 30 of the circuit board includes the circuit board 4, the housing 7 to which the circuit board 4 is fixed, and the fixing screw 27 for fixing the circuit board 4 to the housing 7. Next, a specific structure of the fixing structure 30 of the circuit board will be described below.

(Fixing Structure of Circuit Board)

Figure 3:
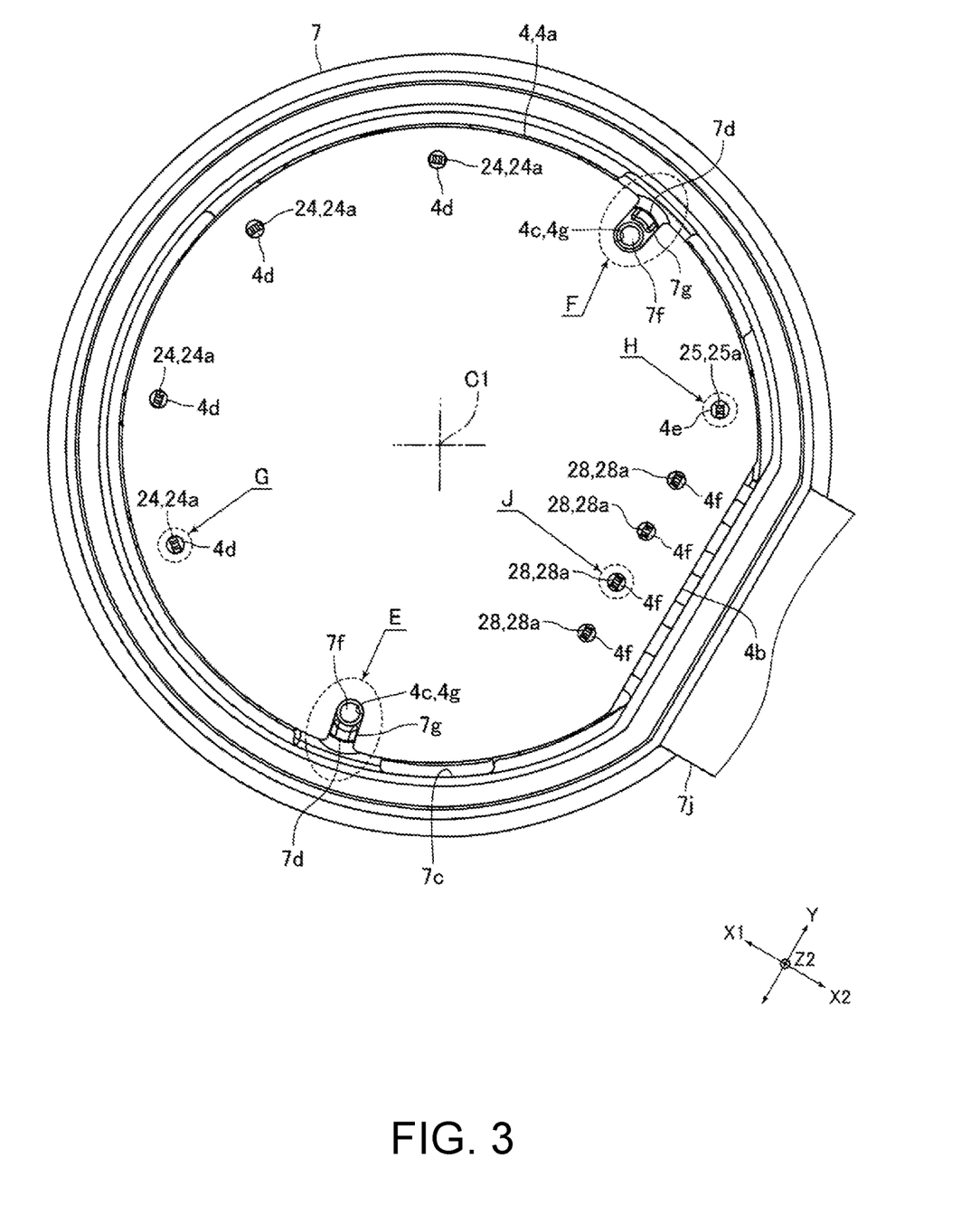
FIG. 3 is a bottom view showing a circuit board, a housing and the like in a state that fixing screws shown in FIG. 2 are detached.
Figure 4:
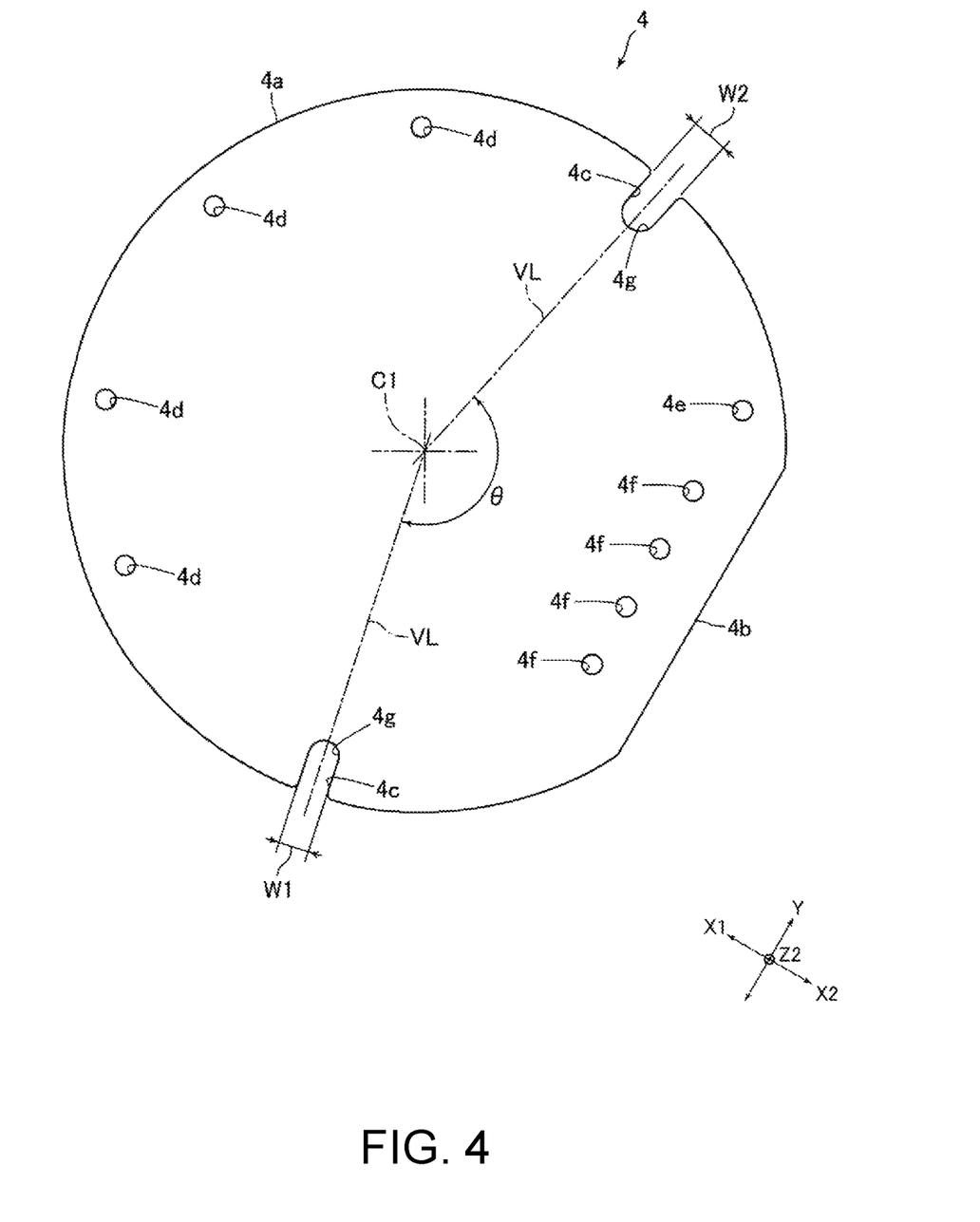
FIG. 4 is a bottom view showing a circuit board in FIG. 2.
Figure 5:
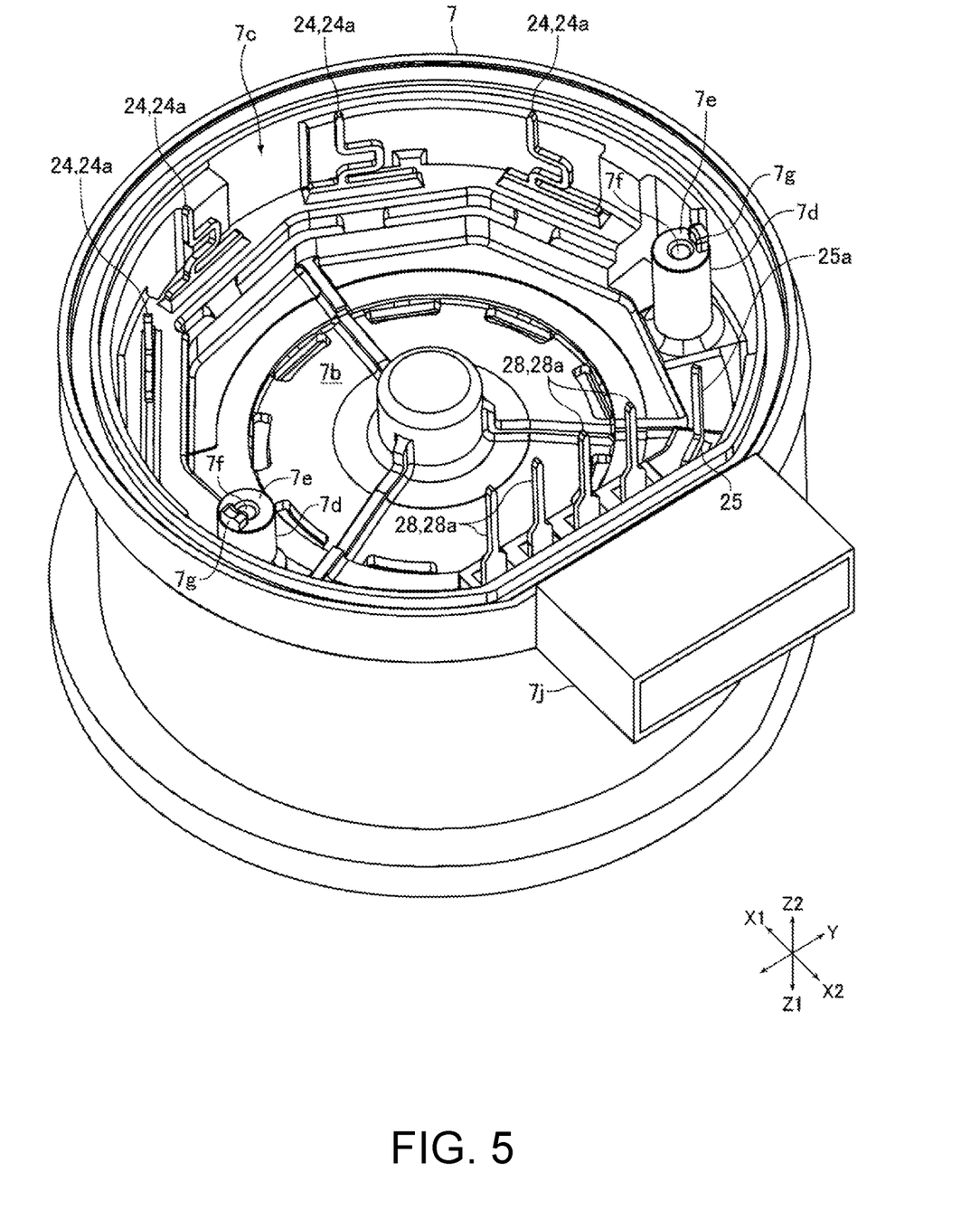
FIG. 5 is a perspective view showing a housing and the like in a state that a circuit board and fixing screws shown in FIG. 2 are detached.
Figure 6A:
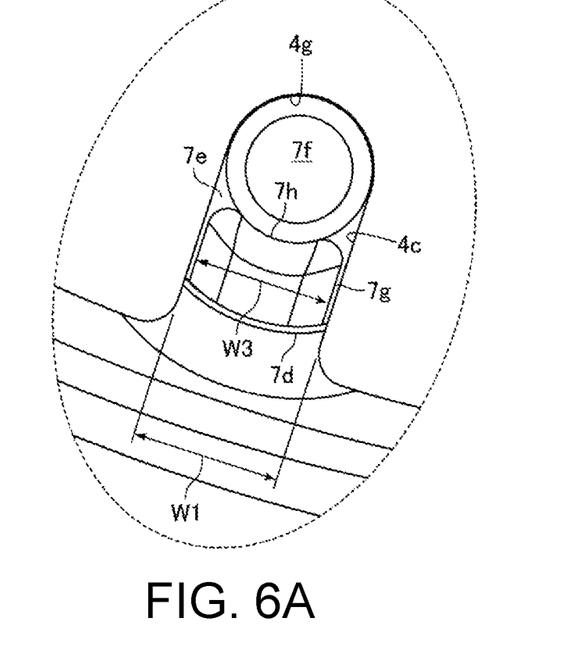
FIG. 6A is an enlarged view showing the "E"-part in FIG. 3.
Figure 6B:
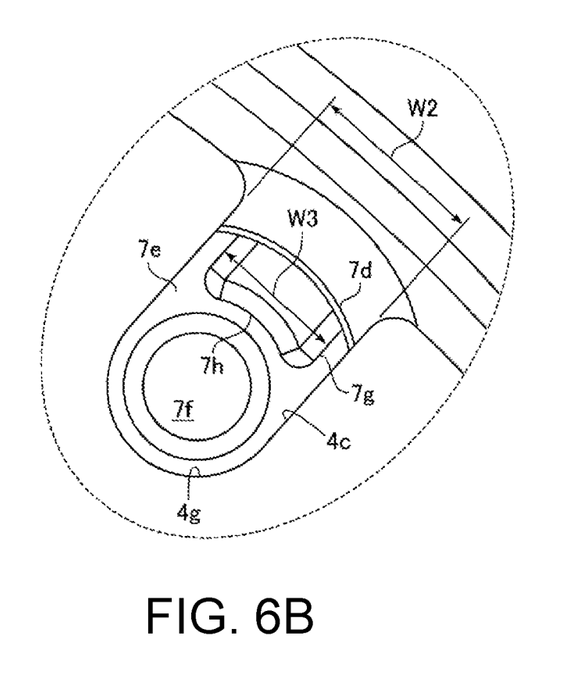
FIG. 6B is an enlarged view showing the "F"-part in FIG. 3.
Figure 6C:
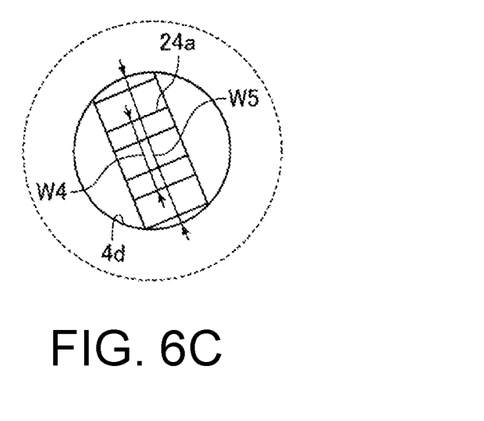
FIG. 6C is an enlarged view showing the "G"-part in FIG. 3.
Figure 6D:
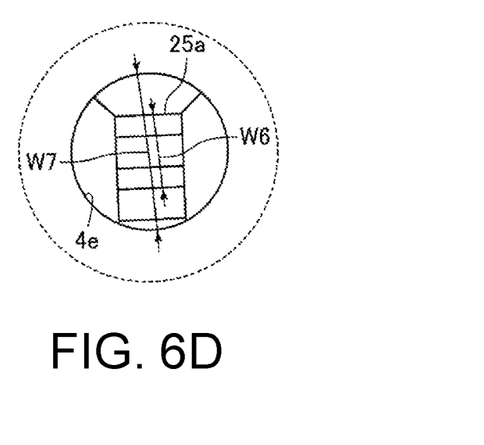
FIG. 6D is an enlarged view showing the "H"-part in FIG. 3.
Figure 6E:
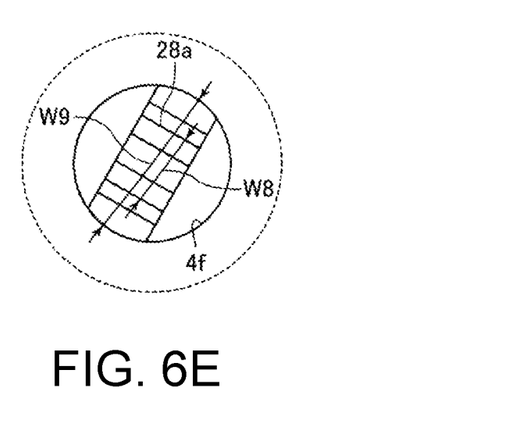
FIG. 6E is an enlarged view showing the "J"-part in FIG. 3.

FIG. 3 is a bottom view showing the circuit board 4, the housing 7 and the like in a state that the fixing screws 27 shown in FIG. 2 are detached. FIG. 4 is a bottom view showing the circuit board 4 in FIG. 2. FIG. 5 is a perspective view showing the housing 7 and the like in a state that the circuit board 4 and the fixing screws 27 shown in FIG. 2 are detached. FIG. 6A is an enlarged view showing the "E"-part in FIG. 3, FIG. 6B is an enlarged view showing the "F"-part in FIG. 3, FIG. 6C is an enlarged view showing the "G"-part in FIG. 3, FIG. 6D is an enlarged view showing the "H"-part in FIG. 3, and FIG. 6E is an enlarged view showing the "J"-part in FIG. 3.

As described above, a thickness direction of the circuit board 4 is coincided with the upper and lower direction. The circuit board 4 is formed in a substantially circular plate shape. When viewed in the upper and lower direction, the center "C1" of the circuit board 4 is disposed on a shaft center of the fixed shaft 17. In this embodiment, an outer shape of the circuit board 4 is formed by cutting out a part on an outer peripheral side of a circular plate whose center is disposed on the shaft center of the fixed shaft 17 in a straight line shape, and the outer peripheral face of the circuit board 4 is structured of a circular arc part 4a which is formed in a circular arc shape with the center "C1" as a center, and a straight part 4b formed in a straight line shape. A central angle of the circular arc part 4a is, for example, about 300°.

A radial direction of the circuit board 4 with the center "C1" as a center is coincided with a radial direction of the rotor 5 whose center is the shaft center of the fixed shaft 17, and a circumferential direction of the circuit board 4 with the center "C1" as a center is coincided with a circumferential direction of the rotor 5 whose center is the shaft center of the fixed shaft 17. In the following descriptions, a radial direction of the circuit board 4 is defined as a "radial direction", and a circumferential direction of the circuit board 4 is defined as a "circumferential direction". Further, in the following descriptions, a predetermined direction perpendicular to an upper and lower direction is referred to as a "front and rear direction", and the "X1" direction side in FIG. 3 and the like which is one side in the front and rear direction is referred to as a "front" side, and the "X2" direction side in FIG. 3 and the like which is an opposite side to the front side is referred to as a "rear" side. Further, the "Y" direction in FIG. 3 and the like perpendicular to the upper and lower direction and the front and rear direction is referred to as a "right and left direction". The straight part 4b is parallel to the right and left direction.

The circuit board 4 is formed with a cut-out part 4c in a "U"-shape which is recessed from an outer peripheral face of the circuit board 4 toward an inner side of the circuit board 4. In this embodiment, two cut-out parts 4c are formed in the circuit board 4. The cut-out part 4c is opened at an outer peripheral end of the circuit board 4. Further, the circuit board 4 is formed with four terminal holes 4d through which the inserted parts 24a of the terminals 24 are passed, one terminal hole 4e through which the inserted part 25a of the terminal 25 is passed, and four terminal holes 4f through which the inserted parts 28a of the terminals 28 are passed. Each of the terminal holes 4d through 4f is a circular hole penetrating through the circuit board 4 in a thickness direction (upper and lower direction) of the circuit board 4. In this embodiment, an outer shape of the circuit board 4 is formed by router processing using an end mill, and the terminal holes 4d through 4f are formed by drilling using a drill.

The cut-out part 4c is cut out toward an inner side in the radial direction from the circular arc part 4a. The cut-out part 4c penetrates through the circuit board 4 in the upper and lower direction. An inner side portion in the radial direction of a side face of the cut-out part 4c is formed to be a curved face 4g in a semi-circular arc shape. A width direction of the cut-out part 4c formed in a "U"-shape is perpendicular to the radial direction. In this embodiment, a width "W1" of one of the two cut-out parts 4c is set to be narrower than a width "W2" of the other of the cut-out parts 4c (see FIG. 4).

The width "W1" of the cut-out part 4c is slightly wider than an outside diameter of a shaft part of the fixing screw 27. Further, the width "W2" of the cut-out part 4c is narrower than an outside diameter of a head part 27a of the fixing screw 27. When viewed in the upper and lower direction, the center "C1" is disposed on a virtual line "VL" which passes a center of the cut-out part 4c in a width direction of the cut-out part 4c (see FIG. 4). An angle "θ" (see FIG. 4) which is formed by two virtual lines "VL" is, for example, about 160°. The two cut-out parts 4c are disposed on a rear side with respect to the center "C1". Further, the two cut-out parts 4c are disposed in bilateral symmetry.

Four terminal holes 4d are formed on a front end side of the circuit board 4. Further, four terminal holes 4d are formed in an outer peripheral side portion of the circuit board 4. Four terminal holes 4d are arranged in a circumferential direction at predetermined intervals in the circumferential direction. A terminal hole 4e and four terminal holes 4f are formed on a rear end side of the circuit board 4. The terminal hole 4e and the four terminal holes 4f are arranged in the right and left direction at predetermined intervals in the right and left direction. The inserted part 24a which is passed through the terminal hole 4d is soldered and fixed to the terminal hole 4d. The inserted part 25a which is passed through the terminal hole 4e is soldered and fixed to the terminal hole 4e, and the inserted part 28a which is passed through the terminal hole 4f is soldered and fixed to the terminal hole 4f.

The housing 7 is formed with two protruding parts 7d which protrude from an upper face of the recessed part 7c toward a lower side. In other words, the housing 7 is formed with the protruding part 7d which protrudes in a thickness direction (upper and lower direction) of the circuit board 4. The protruding part 7d is formed in a cylindrical tube shape. An outside diameter of the protruding part 7d is larger than the widths "W1" and "W2" of the cut-out part 4c. The two protruding parts 7d are disposed at the same positions as the cut-out parts 4c in a circumferential direction. A shaft center of the protruding part 7d formed in a cylindrical tube shape is, in design, disposed at the same position as a center of curvature of the curved face 4g of the cut-out part 4c in the radial direction.

A lower face of the protruding part 7d is formed to be a board contact face 7e with which an upper face of the circuit board 4 is contacted. In other words, the protruding part 7d is formed with the board contact face 7e with which one of faces of the circuit board 4 is contacted. The board contact face 7e is formed to be a flat face in a circular ring shape which is perpendicular to an upper and lower direction. An inner peripheral side of the protruding part 7d is formed to be a screw hole 7f with which a shaft part of the fixing screw 27 is engaged. In other words, the protruding part 7d is formed with the screw hole 7f. The screw hole 7f is recessed from the board contact face 7e toward an upper side. A center of the screw hole 7f is coincided with the shaft center of the protruding part 7d. The center of the screw hole 7f is, in design, disposed at the same position as a center of curvature of the curved face 4g of the cut-out part 4c in the circumferential direction and the radial direction.

Further, the protruding part 7d is formed with a positioning protruded part 7g which is engaged with the cut-out part 4c of the circuit board 4 for positioning the circuit board 4 with respect to the housing 7. The positioning protruded part 7g is protruded from the board contact face 7e toward a lower side. The positioning protruded part 7g is formed in a substantially rectangular solid shape. A height of the positioning protruded part 7g is slightly lower than a thickness of the circuit board 4. The positioning protruded part 7g is formed on an outer side portion of the board contact face 7e in the radial direction and is disposed outside (outer peripheral side) in the radial direction with respect to the screw hole 7f. In other words, the positioning protruded part 7g is disposed on an opening side of the cut-out part 4 with respect to the screw hole 7f.

The positioning protruded part 7g is adjacent to the screw hole 7f in the radial direction. A side face 7h (in other words, a side face on the screw hole 7f side) on an inner side in the radial direction of the positioning protruded part 7g is formed in a curved surface shape in which a shape of the side face 7h when viewed in an upper and lower direction is a circular arc shape with a center of the screw hole 7f as a center of curvature (see FIGS. 6A and 6B). Both side faces of the positioning protruded part 7g in a width direction of the cut-out part 4c are flat faces which are perpendicular to the width direction of the cut-out part 4c. The positioning protruded part 7g is disposed inside the cut-out part 4c. A width "W3" (see FIGS. 6A and 6B) of the positioning protruded part 7g in the width direction of the cut-out part 4c is slightly narrower than the width "W1" of the cut-out part 4c.

In this embodiment, the circuit board 4 is positioned in a circumferential direction with respect to the housing 7 by a side face of the positioning protruded part 7g and a side face of the cut-out part 4c in the width direction of the cut-out part 4c. Further, in this embodiment, as shown in FIG. 4, the two cut-out parts 4c are bilaterally symmetrically disposed, and an angle "θ" which is formed by two virtual lines "VL" is set to be about 160° and thus, the circuit board 4 is positioned in the front and rear direction with respect to the housing 7 by a side face of the positioning protruded part 7g and a side face of the cut-out part 4c in the width direction of the cut-out part 4c.

A difference between the width "W3" of the positioning protruded part 7g and the width "W2" of the cut-out part 4c in the width direction of the cut-out part 4c is set to be smaller than a difference in a circumferential direction between the width "W4" (see FIG. 6C) of the inserted part 24a and the width "W5" (see FIG. 6C) of the terminal hole 4d. In other words, a difference between the width "W3" of the positioning protruded part 7g and the width "W1" of the cut-out part 4c in the width direction of the cut-out part 4c is set to be smaller than the difference between the width "W4" of the inserted part 24a and the width "W5" of the terminal hole 4d in the circumferential direction.

Further, the difference between the width "W3" of the positioning protruded part 7g and the width "W2" of the cut-out part 4c in the width direction of the cut-out part 4c is set to be smaller than a difference in the circumferential direction between the width "W6" (see FIG. 6D) of the inserted part 25a and the width "W7" (see FIG. 6D) of the terminal hole 4e and, in addition, set to be smaller than a difference in the circumferential direction between the width "W8" (see FIG. 6E) of the inserted part 28a and the width "W9" (see FIG. 6E) of the terminal hole 4f. In other words, the difference between the width "W3" of the positioning protruded part 7g and the width "W2" of the cut-out part 4c in the width direction of the cut-out part 4c is set to be smaller than the difference between the width "W6" of the inserted part 25a and the width "W7" of the terminal hole 4e in the circumferential direction, and set to be smaller than the difference between the width "W8" of the inserted part 28a and the width "W9" of the terminal hole 4f in the circumferential direction.

The circuit board 4 is fixed by the fixing screws 27 which are fastened into the screw holes 7f in a state that an upper face of the circuit board 4 is contacted with the board contact face 7e and in a state positioned by the cut-out parts 4c and the positioning protruded parts 7g. A part of a shaft part of the fixing screw 27 is disposed inside the cut-out part 4c. The head part 27a of the fixing screw 27 is contacted with a lower face of the circuit board 4. The fixing screw 27 in this embodiment is a self-tapping screw and, when a shaft part of the fixing screw 27 is fastened into the screw hole 7f, a female screw is formed on an inner peripheral face of the screw hole 7f.

(Principal Effects in this Embodiment)

As described above, in this embodiment, the protruding part 7d of the housing 7 is formed with the screw hole 7f with which a shaft part of the fixing screw 27 is engaged and the positioning protruded part 7g which is engaged with the cut-out part 4c of the circuit board 4, and the screw hole 7f and the positioning protruded part 7g are adjacent to each other in the radial direction. Therefore, according to this embodiment, even when a relative position between the screw hole 7f and the positioning protruded part 7g varies, a deviation amount between a position of the screw hole 7f and a position of the positioning protruded part 7g can be reduced. Accordingly, in this embodiment, a deviation amount between a position of the cut-out part 4c of the circuit board 4, which is positioned by the positioning protruded part 7g and the cut-out part 4c, and a position of the screw hole 7f can be made small.

As a result, in this embodiment, even when a gap space between the cut-out part 4c and the positioning protruded part 7g is made narrow and, further, even when a relative position between the screw hole 7f and the positioning protruded part 7g varies, the fixing screw 27 a part of the shaft part of which is disposed inside the cut-out part 4c can be appropriately fastened to the screw hole 7f. In other words, according to this embodiment, the circuit board 4 can be appropriately positioned with respect to the housing 7 by narrowing a gap space between the cut-out part 4c and the positioning protruded part 7g and, even when a dimension of the housing 7 varies, the fixing screw 27 a part of a shaft part of which is disposed inside the cut-out part 4c can be appropriately fastened to the screw hole 7f.

In this embodiment, the positioning protruded part 7g is disposed on an opening side of the cut-out part 4c with respect to the screw hole 7f. Therefore, according to this embodiment, in comparison with a case that the screw hole 7f is disposed on an opening side of the cut-out part 4c with respect to the positioning protruded part 7g, a contact area of the head part 27a of the fixing screw 27 contacting with a lower face of the circuit board 4 can be increased. Especially, in this embodiment, a center of the screw hole 7f is, in design, disposed at the same position as a center of curvature of the curved face 4g of the cut-out part 4c in the circumferential direction and the radial direction. Therefore, a contact area of the head part 27a of the fixing screw 27 with the circuit board 4 can be increased.

Accordingly, in this embodiment, the circuit board 4 can be appropriately fixed to the housing 7 by the fixing screw 27. Further, in this embodiment, a contact area of the head part 27a of the fixing screw 27 with the circuit board 4 can be increased and thus, although the circuit board 4 can be appropriately fixed to the housing 7 by the fixing screw 27, a contact pressure of the head part 27a of the fixing screw 27 with the circuit board 4 can be prevented from being increased unnecessarily. Therefore, in this embodiment, cracking of the circuit board 4 can be prevented when the fixing screw 27 is fastened.

In this embodiment, an outer shape of the circuit board 4 is formed by router processing. Therefore, according to this embodiment, in comparison with a case that an outer shape of the circuit board 4 is formed by press working, an end face of the circuit board 4 can be formed smoothly and, as a result, quality of the circuit board 4 can be enhanced. Further, according to this embodiment, in comparison with a case that an outer shape of the circuit board 4 is formed by press working, an outer shape of the circuit board 4 can be formed with a high degree of accuracy. In this embodiment, the cut-out part 4c which is recessed from an outer peripheral face of the circuit board 4 toward an inner side of the circuit board 4 is formed in a "U"-shape and thus, even when an outer shape of the circuit board 4 is formed by router processing, the cut-out part 4c can be easily formed in the circuit board 4.

In this embodiment, differences between the width "W3" of the positioning protruded part 7g and the widths "W1" and "W2" of the cut-out parts 4c in the width direction of the cut-out part 4c are set to be smaller than a difference between the width "W4" of the inserted part 24a and the width "W5" of the terminal hole 4d in the circumferential direction. Therefore, according to this embodiment, the inserted part 24a can be prevented from contacting with a side face of the terminal hole 4d. Accordingly, in this embodiment, quality of a soldered portion of the inserted part 24a which is soldered and fixed to the terminal hole 4d can be secured.

Further, in this embodiment, the differences between the width "W3" of the positioning protruded part 7g and the widths "W1" and "W2" of the cut-out parts 4c in the width direction of the cut-out part 4c are set to be smaller than a difference between the width "W6" of the inserted part 25a and the width "W7" of the terminal hole 4e in the circumferential direction, and set to be smaller than a difference between the width "W8" of the inserted part 28a and the width "W9" of the terminal hole 4f in the circumferential direction. Therefore, the inserted part 25a can be prevented from contacting with a side face of the terminal hole 4e, and the inserted part 28a can be prevented from contacting with a side face of the terminal hole 4f. Accordingly, in this embodiment, quality of a soldered portion of the inserted part 25a which is soldered and fixed to the terminal hole 4e can be secured, and quality of a soldered portion of the inserted part 28a which is soldered and fixed to the terminal hole 4f can be secured.

In this embodiment, a shape of the side face 7h on the screw hole 7f side of the positioning protruded part 7g when viewed in an upper and lower direction is formed in a curved surface shape which is a circular arc shape with a center of the screw hole 7f as a center of curvature. Therefore, according to this embodiment, a shaft part of the fixing screw 27 which is fastened into the screw hole 7f is easily guided into the screw hole 7f by utilizing the side face 7h of the positioning protruded part 7g. Accordingly, in this embodiment, fastening work of the fixing screw 27 can be performed easily.

Other Embodiments

Although the present invention has been shown and described with reference to a specific embodiment, various changes and modifications will be apparent to those skilled in the art from the teachings herein.

In the embodiment described above, the number of the cut-out parts 4c formed in the circuit board 4 and the number of the protruding parts 7d formed in the housing 7 may be three or more. In other words, the circuit board 4 may be fixed to the housing 7 by three or more fixing screws 27 in a state that the circuit board 4 is positioned at three or more positions with respect to the housing 7 through the cut-out part 4c and the positioning protruded part 7g. Further, if the circuit board 4 is capable of being appropriately positioned and fixed to the housing 7, the number of the cut-out part 4c of the circuit board 4 and the number of the protruding part 7d of the housing 7 may be one.

In the embodiment described above, a width direction of the cut-out part 4c is not required to be perpendicular to the radial direction. In this case, when viewed in an upper and lower direction, the center "C1" is not disposed on the virtual line "VL". Further, in the embodiment described above, a center of the screw hole 7f may be, in design, disposed at a position deviated from a center of curvature of the curved face 4g of the cut-out part 4c in the radial direction. Further, in the embodiment described above, the protruding part 7d may be formed in a shape other than a cylindrical tube shape. For example, the protruding part 7d may be formed in a rectangular tube shape.

In the embodiment described above, the side face 7h of the positioning protruded part 7g is not required to be formed in a curved surface shape. For example, the side face 7h may be formed in a flat face shape. Further, the fixing structure 30 of the circuit board to which the present invention is applied may be used in a device other than the pump device 1. In this case, the board fixing member to which the circuit board 4 is fixed may be formed of material other than resin. For example, the board fixing member may be formed of metal.

Structures of Embodiments

Embodiments of the present invention may be structured as follows.
(1) A fixing structure of a circuit board which includes:
circuit board which is a rigid board in a flat plate shape;
a board fixing member to which the circuit board is fixed; and
a fixing screw for fixing the circuit board to the board fixing member;
where the circuit board is formed with a cut-out part in a "U"-shape which is recessed from an outer peripheral face of the circuit board toward an inner side of the circuit board;
the board fixing member is formed with a protruding part which protrudes in a thickness direction of the circuit board;
the protruding part is formed with a board contact face in a flat face shape with which one of faces of the circuit board is contacted, a screw hole with which a shaft part of the fixing screw is engaged, and a positioning protruded part which is engaged with the cut-out part for positioning the circuit board with respect to the board fixing member;
the screw hole is recessed from the board contact face;
the positioning protruded part protrudes from the board contact face;
a part of the shaft part of the fixing screw is disposed inside the cut-out part;
a head part of the fixing screw is contacted with another one of the faces of the circuit board; and
the positioning protruded part is disposed on an opening side of the cut-out part with respect to the screw hole.
(2) The fixing structure of the circuit board described in the above-mentioned structure (1), where
the circuit board is formed with a terminal hole through which an inserted part of a terminal is passed,
the circuit board is positioned with respect to the board fixing member in a circumferential direction with a center of the circuit board as a center by a side face of the positioning protruded part and a side face of the cut-out part in a width direction of the cut-out part formed in the "U"-shape, and
a difference between a width of the positioning protruded part and a width of the cut-out part in the width direction of the cut-out part is smaller than a difference between a width of the inserted part and a width of the terminal hole in the circumferential direction.
(3) The fixing structure of the circuit board described in the above-mentioned structure (1) or (2), where a shape of a side face on the screw hole side of the positioning protruded part when viewed in the thickness direction of the circuit board is formed in a curved surface shape which is a circular arc shape whose center of curvature is a center of the screw hole.
(4) A pump device which includes:
the fixing structure of the circuit board described in one of the above-mentioned structures (1) through (3);
an impeller;
a rotor to which the impeller is attached and which has a drive magnet;
a stator which is formed in a tube shape and is disposed on an outer peripheral side with respect to the rotor and has a drive coil; and
a pump chamber in which the impeller and the rotor are disposed and through which fluid is passed;
where the stator includes a terminal with which an end part of the drive coil is electrically connected;
the board fixing member is formed of resin and is integrally formed with the stator in a manner as to cover a part of the stator;
the circuit board is disposed outside the pump chamber; and
the circuit board is electrically connected with the terminal.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:
1. A fixing structure for a circuit board, the fixing structure comprising:
a circuit board formed as a rigid board in a flat disc shape, the circuit board including a "U"-shaped cut-out part which is recessed from an outer peripheral edge of the circuit board towards a center of the circuit board;
a board fixing member including a protruding part extending in a thickness direction of the circuit board, and a screw hole defined by the protruding part; and
a fixing screw including a shaft part configured to engage the screw hole so as to fix the circuit board to the board fixing member,
wherein an end of the protruding part includes a flat board contact face configured to contact a first axial side of the circuit board, and a positioning protruded part extending from the board contact face so as to engage the cut-out part such that the circuit board is rotationally positioned with respect to the board fixing member,
wherein the screw hole is recessed from the board contact face, wherein the shaft part of the fixing screw extends through the cut-out part, wherein a head part of the fixing screw is configured to contact a second axial side of the circuit board, and wherein the positioning protruded part is disposed between the screw hole and the outer peripheral edge of the circuit board.

2. The fixing structure according to claim 1, wherein:

the circuit board further includes a terminal hole through which an inserted part of a terminal is passed, and in a circumferential direction of the circuit board, a difference between a width of the positioning protruded part and a width of the cut-out part is less than a difference between a width of the inserted part and a width of the terminal hole.

3. The fixing structure according to claim 2, wherein a radially inner surface of the positioning protruded part is formed as a circular arc including a center of curvature which coincides with a center of the screw hole.

4. A pump device comprising:

the fixing structure according to claim 2;

a rotor including a drive magnet;

an impeller attached to the rotor within a pump chamber so as to convey a fluid; and a cylindrical stator concentrically disposed about the rotor, the stator including a drive coil and the terminal which is electrically connected to an end part of the drive coil, wherein the board fixing member is integrally formed over the stator so as to cover a part of the stator, wherein the board fixing member is made of resin, wherein the circuit board is disposed outside the pump chamber, and wherein the circuit board is electrically connected with the terminal.

5. The fixing structure according to claim 1, wherein a radially inner surface of the positioning protruded part is formed as a circular arc including a center of curvature which coincides with a center of the screw hole.

6. A pump device comprising:

the fixing structure according to claim 1;

a rotor including a drive magnet;

an impeller attached to the rotor within a pump chamber so as to convey a fluid; and a cylindrical stator concentrically disposed about the rotor, the stator including a drive coil and a terminal electrically connected to an end part of the drive coil, wherein the board fixing member is integrally formed over the stator so as to cover a part of the stator, wherein the board fixing member is made of resin, wherein the circuit board is disposed outside the pump chamber, and wherein the circuit board is electrically connected to the terminal.

* * * * *